US010522552B2

(12) United States Patent
Ryckaert et al.

(10) Patent No.: US 10,522,552 B2
(45) Date of Patent: Dec. 31, 2019

(54) METHOD OF FABRICATING VERTICAL TRANSISTOR DEVICE

(71) Applicant: IMEC VZW, Leuven (BE)

(72) Inventors: Julien Ryckaert, Schaerbeek (BE); Naoto Horiguchi, Leuven (BE); Dan Mocuta, Herent (BE); Trong Huynh Bao, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/980,604

(22) Filed: May 15, 2018

(65) Prior Publication Data

US 2018/0342524 A1 Nov. 29, 2018

(30) Foreign Application Priority Data

May 15, 2017 (EP) .................................... 17171130

(51) Int. Cl.
*H01L 21/8234* (2006.01)
*H01L 27/11* (2006.01)
(Continued)

(52) U.S. Cl.
CPC .. *H01L 27/1104* (2013.01); *H01L 21/823431* (2013.01); *H01L 21/823487* (2013.01);
(Continued)

(58) Field of Classification Search
CPC ..... H01L 21/823418; H01L 21/823431; H01L 21/823487; H01L 21/823814;
(Continued)

(56) References Cited

U.S. PATENT DOCUMENTS 5,578,850 A 11/1996 Fitch et al.
5,780,327 A * 7/1998 Chu .................. H01L 29/66666
257/E21.41

(Continued)

OTHER PUBLICATIONS

Extended European Search Report dated Nov. 24, 2017 in Application No. 17171130.2 in 9 pages.
(Continued)

*Primary Examiner* — Stephen W Smoot
(74) *Attorney, Agent, or Firm* — Knobbe Martens Olson & Bear, LLP

(57) ABSTRACT

The disclosed technology generally relates semiconductor devices and more particularly to a vertical transistor device, and a method of fabricating the same. In one aspect, the method includes providing, on a substrate, a fin formed of a stack of a first layer, a second layer and a third layer, wherein the second layer is positioned above the first layer and the third layer is positioned above the second layer. The method additionally includes forming a dielectric on the sidewalls of the first and third layers of the fin selectively against a sidewall of the second layer, and the method additionally includes forming a gate contacting layer for contacting a sidewall of the second layer. The first and third layers define a source region and a drain region, respectively, of the vertical transistor device. The second layer defines a channel region of the vertical transistor device. The dielectric on the sidewalls of the first and third layers electrically isolates the source and drain regions from the gate contacting layer.

15 Claims, 7 Drawing Sheets

(51) Int. Cl.
*H01L 27/088* (2006.01)
*H01L 29/66* (2006.01)
*H01L 29/417* (2006.01)
*H01L 29/78* (2006.01)
*H01L 21/8238* (2006.01)
*H01L 27/092* (2006.01)
*H01L 29/786* (2006.01)

(52) U.S. Cl.
CPC .. *H01L 21/823885* (2013.01); *H01L 27/0886* (2013.01); *H01L 27/092* (2013.01); *H01L 29/41741* (2013.01); *H01L 29/66666* (2013.01); *H01L 29/66787* (2013.01); *H01L 29/785* (2013.01); *H01L 29/7827* (2013.01); *H01L 29/78642* (2013.01); *H01L 2029/7858* (2013.01)

(58) Field of Classification Search
CPC ..... H01L 21/823821; H01L 21/823885; H01L 27/0886; H01L 27/0924; H01L 29/41741; H01L 29/41791; H01L 29/66666; H01L 29/66787; H01L 29/66795; H01L 29/7827; H01L 29/785; H01L 29/7851; H01L 29/7853; H01L 29/7856; H01L 2029/7858

See application file for complete search history.

(56) References Cited

U.S. PATENT DOCUMENTS

| | | |
|---|---|---|
| 6,060,723 A | 5/2000 | Nakazato et al. |
| 6,204,532 B1 | 3/2001 | Gambino et al. |
| 7,060,539 B2 | 6/2006 | Chidambarrao et al. |
| 7,078,280 B2 | 7/2006 | Chaudhry et al. |
| 8,153,483 B2 | 4/2012 | Sun |
| 8,946,670 B1 | 2/2015 | Park |
| 9,177,785 B1 | 11/2015 | Kelly et al. |
| 9,530,866 B1 | 12/2016 | Zhang et al. |
| 9,620,509 B1 | 4/2017 | Pao et al. |
| 2011/0068418 A1 | 3/2011 | Lung |
| 2017/0005188 A1 | 1/2017 | Cheng et al. |
| 2017/0365714 A1* | 12/2017 | Bu .................... H01L 29/7827 |

OTHER PUBLICATIONS

Wikipedia, the free encyclopedia, "Self-aligned gate", https://en.wikipedia.org/wiki/Selfaligned_gate in 6 pages, Nov. 11, 2016.

* cited by examiner

METHOD OF FABRICATING VERTICAL TRANSISTOR DEVICE

CROSS-REFERENCE TO RELATED APPLICATIONS

This application claims foreign priority to European Patent Application No. EP 17171130.2, filed May 15, 2017, the content of which is incorporated by reference herein in its entirety.

BACKGROUND

Field

The disclosed technology generally relates semiconductor devices and more particularly to a vertical transistor device, and a method of fabricating the same.

Description of the Related Technology

There is a general objective in the semiconductor industry to scale integrated circuit (IC) devices, e.g., by reducing the area occupied by discrete devices such as transistors, and to correspondingly increase the device density per unit area. For example, in the context of memory devices, there is an objective to provide smaller integrated circuits with reduced memory bit cell area and increased circuit density.

The development has recently been towards vertical transistors which would provide even smaller layout area than previous transistor based designs. To this end, various new process architectures for semiconductor devices are being developed to provide more area-efficient circuit designs. One type of scalable device includes vertical channel transistor devices, such as vertical nanowire field effect transistors (FETs). In vertical nanowire FETs, due to the vertically oriented channel structure, the lateral footprint occupied by the gate length does not scale with a linewidth of the gate as in traditional planar FETs but instead scales with the thickness of the gate. Such transistors allow, among other things, reduced gate lengths while minimizing issues with short channel effects associated with planar devices.

Further, the source and drain regions of a vertical transistor device are vertically displaced in relation to each other. For these reasons, among others, vertical transistor devices enable dense device integrations. However, making vertical transistors may be a quite complex and expensive process. Thus, there is a need for improved methods for making such transistor devices.

SUMMARY OF CERTAIN INVENTIVE ASPECTS

An objective of the disclosed technology is to provide an improved method of defining a channel region in a transistor device. Further and alternative objectives may be understood from the following.

In one aspect of the disclosed technology, a method of defining a channel region in a vertical transistor device comprises providing, on a substrate, a fin formed of a stack of a first layer, a second layer and a third layer, wherein the second layer is positioned above the first layer and the third layer is positioned above the second layer. The method additionally comprises selectively forming a dielectric on the sidewalls of the first and third layers of the fin. The method further comprises forming a gate contacting layer for contacting a sidewall of the second layer.

The first and third layers defines a source and drain region, respectively, of the vertical transistor device;

the second layer defines a channel region of the vertical transistor device; and the dielectric on the sidewalls of the first and the third layer electrically isolates the source and drain regions from the gate contacting layer.

The disclosed technology enables a method of aligning a channel region vertically in a transistor device. This is done by selectively forming a dielectric on the sidewalls of the source and drain regions of the fin, such that the gate contacting layer, which contacts the channel region defined by the surface sidewall of the second layer, may be electrically isolated from the source and drain regions. The selective deposition of the dielectric hence allows for a self-alignment of the gate contacting layer at the channel region, which simplifies the processing of the device. The method may, advantageously, therefore be applied for forming vertical transistors. The method may be particularly advantageous for forming circuitry including cross-coupled complementary metal oxide semiconductors (CMOS), notably Static Random Access Memory cells (SRAM cells).

The fin may be understood as a feature which at least along a portion of its length may extend in a straight line and presents a uniform width. The fin may be formed by etching a stacked structure comprising a plurality of layers, such that the resulting fin is a multi-layered structure. The width of the fin, and the minimum distance between neighbouring fins, may be defined using multiple patterning techniques, such as self-aligned double patterning (SADP) or quadruple patterning (SAQP).

A "stack" of layers may comprise layers being arranged above or on top, of each other, for example, in the vertical direction.

A layer, a level or other element, being formed "above" a first feature such as a layer, a level or other element, may mean that the second feature is formed above the first feature along (or as seen) in the vertical direction.

A vertical transistor device may mean a transistor device where the source and the drain region are arranged above each other. As the current flows in the vertical direction, the device may be considered to form a vertical transistor device.

The term "contacting layer" may mean a layer being in electric contact with the other layer, for example, indirectly via an electric field or directly by means of an ohmic contact.

In the context of the present application, the term "gate contacting layer" or "gate level" may refer to a structure including conductive paths that are separated from each other by an electrically insulating material or dielectric. The conductive paths, which also may be referred to as gate lines, may extend on the sidewalls of the fins, between the fins and on the fins. Thus, it will be appreciated that the term "layer" or "level" is not restricted to a planar structure or conductive material. On the contrary, it may comprise gate lines extending in different vertical levels and which are electrically isolated from each other.

The term "channel" or "channel region" may refer to the functional part of the transistor structure that is arranged between the source and drain region, and through which the current may flow when the transistor device is in its conducting state.

Further, the terms "gate", "gate contact" or "gate electrode" may refer to the portion of the gate contacting layer or gate lines that is arranged at the channel region, and by which the conductive state of the transistor device may be controlled. Thus, the gate contact may refer to the part of the gate contacting layer that is contacting the sidewall(s) of the second layer of the fin, i.e., the channel region of the transistor device formed by the fin. It will be appreciated that the gate electrode may be arranged on only one side of the fin, or on both sides. Further, in case the fin has been formed into a pillar, the gate electrode may be arranged also on one or both of the remaining sidewalls of the pillar. In case the gate electrode is arranged to surround the pillar, the transistor device may be referred to as a gate-all-around transistor.

The term "selectively forming" may mean a process which results in a dielectric being formed on the sidewalls of the first and third layer, but not on the second layer of the fin. Thus, the resulting structure allows for the channel region to be contacted by the subsequently added gate contacting layer, while the source and drain regions remain electrically isolated from the gate contacting layer. The selective forming may be performed in a single process, or by means of a plurality of processing steps. Different exemplifying embodiments will be discussed in further detail in the following.

The selectivity of the deposition of the dielectric may e.g. be achieved by forming the sidewall of the second layer of a material that is less prone to form (or receive or build up) a dielectric compared to the material of the sidewalls of the other layers. This may, for example, be done by combining two materials having a different rate of oxidation, such that the material of the first and third layers under certain conditions may form a much thicker oxide layer than the material of the second layer. Accordingly, the conditions, such as, for example, environmental or process parameters relating to temperature and pressure during the oxide forming process, may be selected so as to increase the ratio between the rate of the oxidation of the first and third layers compared to the rate of the oxidation of the second layer of the fin.

Further, it is appreciated that in case some dielectric material is deposited also on the sidewalls of the second layer, it may be removed in a subsequent processing step. The removal may be selective, such that the dielectric is removed from the second layer but not the first and third layers, or uniform. In case the removal is uniform, the dielectric may form a thicker layer at the first and third layers so as to allow at least some dielectric to remain on the first and third layers after removal of the dielectric from the second layer.

Thus, according to an embodiment, the step of selectively forming the dielectric may comprise oxidizing the first, second and third layer at a temperature and pressure selected such that a thicker dielectric is provided on the first and third layers than on the second layer. In order to remove the dielectric that has been formed, even though at much lower rate, on the sidewall of the second layer, a subsequent step of etching the dielectric to expose the sidewall of the second layer may be added, such that at least some of the dielectric remains on the first and third layers to isolate the source and drain regions from the gate contacting layer.

The dielectric may hereby refer to a specific oxide. Thus, at a specific temperature and/or pressure the different materials on the layers oxidize at different speed. By selecting the temperature and/or pressure such that the dielectric is formed at a higher rate on the first and third layers than on the second layer, the dielectric is getting different thicknesses on the sidewalls. For example, the second layer may get nothing or a very thin layer and the first and third layers may get a thick layer compared to the second layer. Achieving these different thicknesses may be seen as a selective deposition. In one example, the first and the third layer may be formed of silicon germanium, SiGe and the second layer may be formed of silicon, Si. Hence, the SiGe may oxidize at a higher rate compared to the Si layer at the same temperature and/or pressure.

Alternative, or additional examples of selectively forming the dielectric may be to functionalize (or prepare) the surface of the layers such that the dielectric is growing faster on sidewall surfaces of the first and third layers compared to the sidewall surface(s) of the second layer. Examples of functionalization may include atomic layer deposition (ALD) to enhance deposition on the sidewall surfaces of the first and third layers, or ALD or chemical vapour deposition (CVD) to inhibit nucleation of the sidewall surface of the second layer. Other examples of functionalization of the sidewall surfaces of the fins may be to make use of hydrophilic —H bonds and hydrophobic —O—H bonds to achieve a selectivity in the forming of the dielectric.

In another embodiment, the method may comprise the step of forming a gate oxide stack on at least one sidewall of the second layer prior to forming the gate contacting layer. The gate oxide stack allows for a field-effect transistor (FET). The gate oxide may be a high-κ dielectric (which has a high dielectric constant κ). Using high-κ material allows for increased gate capacitance without the associated leakage effects.

According to one embodiment, at least two parallel fins may be provided. Further, the gate contacting layer may comprise at least three parallel gate lines, wherein each gate line may be isolated from the other and extend over both fins in an orthogonal direction relative the at least two fins.

Thus, the fins may be parallel, wherein the gate contacting layer may be formed of parallel gate lines extending orthogonal to the fins. Each gate line may follow the contour of the fins, i.e. being arranged above, along the sidewalls of the fins and extending between neighbouring fins. The intersection between a gate line and a fin may define the location of a transistor device, which hence may be formed in the vertical region below the intersection. The vertical region may in other words be understood as a vertically extending portion of the fin.

According to an embodiment, each fin may comprise a first vertical region for forming a N-type transistor device, and a second vertical region for forming a P-type transistor device. This allows for the fins being formed into different types of logical components, such as logic cells, inverters and memory bit cells requiring different combinations of transistor types. The vertical regions may comprise a stacked structure formed of the first, second and third layer, wherein the first and third layers may be N-doped or P-doped and the second layer P-doped, N-doped or not doped at all, depending on the type of transistor to be formed. In some examples, the vertical region may form an NMOS transistor, in which the source/drain regions may be highly n-doped (N++) and the channel region lightly doped (P, intrinsic or N) or not doped at all. Accordingly, the vertical region may form a PMOS transistor, in which the source/drain regions may be highly p-doped (P++) whereas the channel region may have the same doping as the channel region of the NMOS transistor.

Each fin may be formed into several pillars, each forming a transistor device, by means of an etching process that separates the vertical regions from each other. This may for example be performed by means of a hard mask, which may be provided with a pattern that is transferred into the fin. In one example, the gate lines may be used as an etch mask to cut the fins into pillars. The etching may be performed only through the third and second layer, such that the material of the first layer remains between the vertical regions of the fin, thereby forming a bottom electrode. By the term "pillar" should hence be understood as an upright structure or a post, which may be formed as the fin is cut into pieces by e.g. etching. The pillar may e.g. be formed of the two upper layers of the fin, leaving the lower layer intact to interconnect the bottom regions of the transistor of the fin, or by all three layers in case isolated transistors (i.e., not sharing S/D regions) are formed.

According to one embodiment, a first one of the fins may be formed into a first transistor device, a second transistor device and a third transistor device, whereas a second one of the fins may be formed into a fourth transistor device, a fifth transistor device and a sixth transistor device. Each one of the fins may comprise a transistor pair comprising a P-type and N-type transistor device. Thus, it will be realised that each fin may be formed into e.g. two N-type transistor devices and one P-type transistor device, or one N-type transistor device and two P-type transistor devices, allowing logic components to be formed. By cutting only the two upper layers of the fin, two transistor devices may be formed, which share the bottom layer such that the source of a first one of the transistors is shared with the drain of the second one of the transistors. This structure, in which e.g. a P-type transistor and an N-type transistor share source/drain regions via the first layer, may be used to form e.g. an inverter.

According to one embodiment, the gate lines may be interrupted in between the fins such that the gates of the transistor devices in the first fin are isolated from the gates of the transistor devices in the second fin.

In one embodiment, the transistor devices of each of the fins may be connected to their neighbour transistor device by a drain connection formed by the first layer of that fin, or by cutting the first layer to separate the transistor devices from each other and then regrow the first layer to form a bottom electrode. In this way the first layer may be used both for interconnecting the transistor devices and for forming the drain regions, which allows of an efficient layout. This formation may e.g. facilitate the integration of the devices in the memory array of an SRAM cell.

In the context of the present application, "neighbouring transistor devices" may refer to transistor devices of the same fin.

By the term "SRAM cell" or "SRAM bit cell" is hereby meant an SRAM device comprising at least two cross-coupled inverters for storing data. The terms may be interchangeably used throughout the text.

In one embodiment, the first layer may be silicided in the region of the first layer of each fin after the source/drain regions have the proper doping type, so as to form the drain connection between two neighbouring transistors. In this way, the silicidation of the PN junctions may reduce the access resistance to the source/drain regions.

In one embodiment, the gates of the transistor pair of each fin may be electrically connected to each other and to the drain connection of the transistor pair in the other fin. This allows for the formation of an SRAM cell, in which the electrical interconnections may be formed at least in the region between the two parallel fins. By this arrangement of the electrical connections a more compact design of the SRAM cell may be achieved.

In one embodiment, the electrical connection to the drain connection may extend beyond the region in between the two parallel fins. This allows for the bottom electrode (i.e., the portion of the first layer arranged between two pillars) to be contacted on the highly doped (and possibly silicided) region of the first layer on either side of the pillar forming the transistor device.

In one embodiment, the SRAM cell may further have an electrical connection for a bit-line (BL) and word-line (WL), which may be connected to the respective gate of the remaining transistors devices (i.e., the transistor devices not included in the pair of transistor devices) of each of the fins. These electrical connections may be formed at least in the region between the two parallel fins so as to allow for a compact design. In this way, the SRAM cell may be electrically connected to the WL for controlling access to the cell during read and write operations. In case the gate electrode is provided on both sidewalls of the fins forming the pillar, the gate may be accessed from either side of the fin.

As already mentioned, the term "remaining transistors" may hereby mean the transistors that are not included in the transistor pair that is electrically connected to the drain connection of the other fin.

In one embodiment, the second layer may be formed of silicon (Si) and the first layer and the third layer may be formed of silicon-germanium (SiGe). Alternatively, the second layer may be formed of SiGe and the first layer and the third layer formed of Si. The materials, such as e.g. Si and SiGe as mentioned herein, may be doped during the formation of each layer (e.g. in the form of impurities added during epitaxial growth) or after a layer has been formed (e.g. by means of ion implantation).

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

A method of defining a channel region in a transistor device will now be described with reference to FIGS. 1-8.

Figure 1:
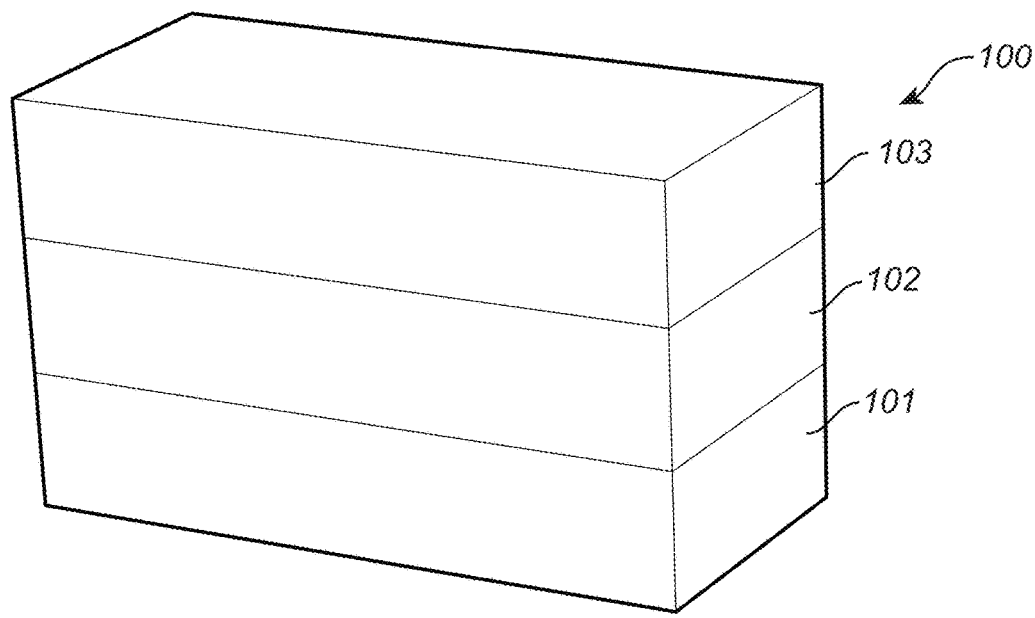
FIG. 1 illustrates a perspective view of a stacked structure. The stacked structure may comprise a first layer, a second layer, and a third layer.

In FIG. 1, a perspective view of a stacked structure 100 is disclosed. The stacked structure 100 may comprise a first layer 101, a second layer 102 and a third layer 103. The first layer may be arranged at the bottom of the layers, whereas the second layer may be positioned above the first layer and the third layer may be positioned at the top of the layers or above the second layer. The stacked structure 100 may be arranged on a semiconductor substrate (not shown in the figures). When forming a vertical transistor device, the source region may be defined by the first layer, the gate region by the second layer and the drain region by the third layer. The material of the first and third layers may be formed of, for example, silicon-germanium (SiGe). The second material may be different to the first and third material, and may, for example, be silicon (Si).

Figure 2:
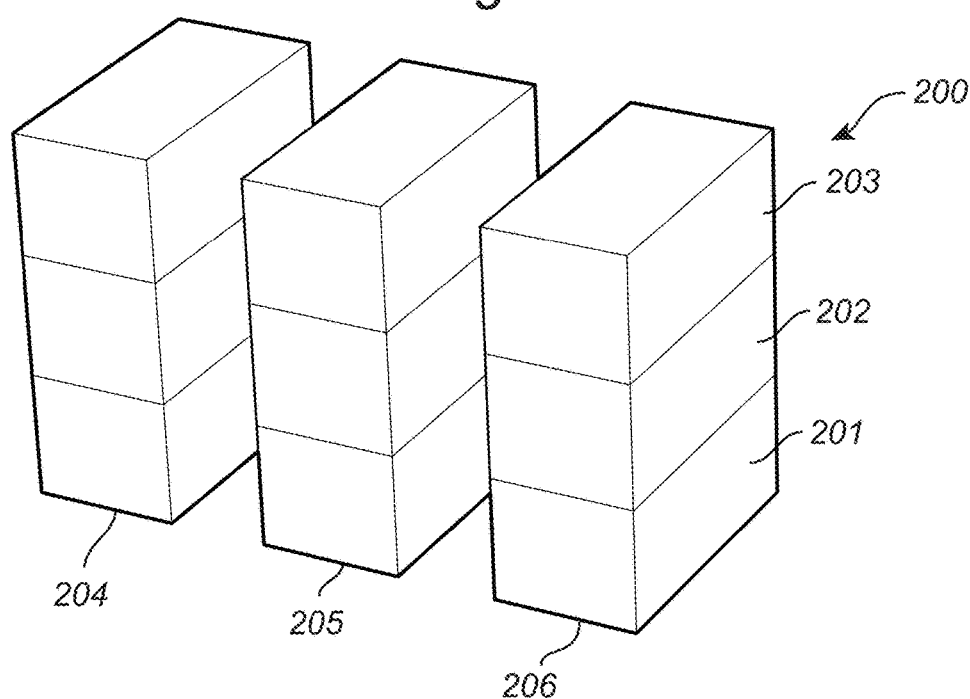
FIG. 2 illustrates a perspective view of a stacked structure that has been etched across the stack in the vertical direction by using a patterned resist layer and preferably aniosotropic etch, thus forming three parallel fins, wherein each fin has three layers.

FIG. 2 shows a perspective view of a stacked structure 200 similar to the structure described in connection with FIG. 1 above, that has been etched across the stack in the vertical direction by using a patterned resist layer and a preferably anisotropic etch, thus forming three parallel fins 204, 205, 206, where each fin has three layers 201, 202, 203.

Figure 3:
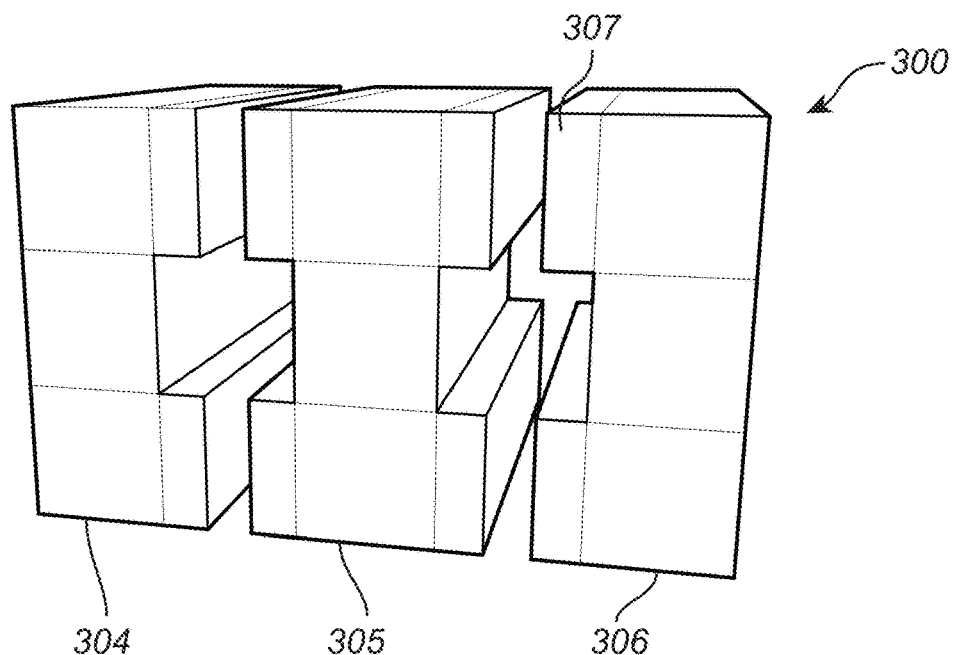
FIG. 3 illustrates a perspective view of a stacked structure, with a dielectric layer selectively formed on a surface of the vertical sidewalls of the third layer and the first layer.

FIG. 3 shows a perspective view of a stacked structure 300, which may be similar to the structure described with reference to FIG. 2, with three parallel fins 304, 304, 305 having a first layer 301, a second layer 302 and a third layer 303. As indicated in the present figure, a dielectric 307 may be selectively formed on a surface of the vertical sidewalls of the third 303 and the first layer 301. The dielectric 307 may thus form an electric isolation of the sidewalls of first and third layers of the fin, while leaving the sidewall(s) of the second layer uncovered so as to allow it to be contacted by a gate contacting layer.

There are different techniques for selectively forming the dielectric 307 on the sidewalls of the fins 304, 305, 306. A method according to an example comprises oxidizing the first layer 301, the second layer 302 and the third layer 303 at a temperature and pressure selected such that the thickness of the dielectric is growing faster on the first 301 and third layer 303 than on the second layer 302. In this way a thicker dielectric layer on the first and third layers may be produced, and a relatively thin dielectric layer, or no dielectric at all, formed on the sidewall(s) of the second layer. The dielectric may then be etched to expose the sidewall of the second layer. An even etch of the dielectric may result in that the dielectric being completely be removed from the second layer, whereas at least some dielectric remains on the first and third layer.

Figure 4:
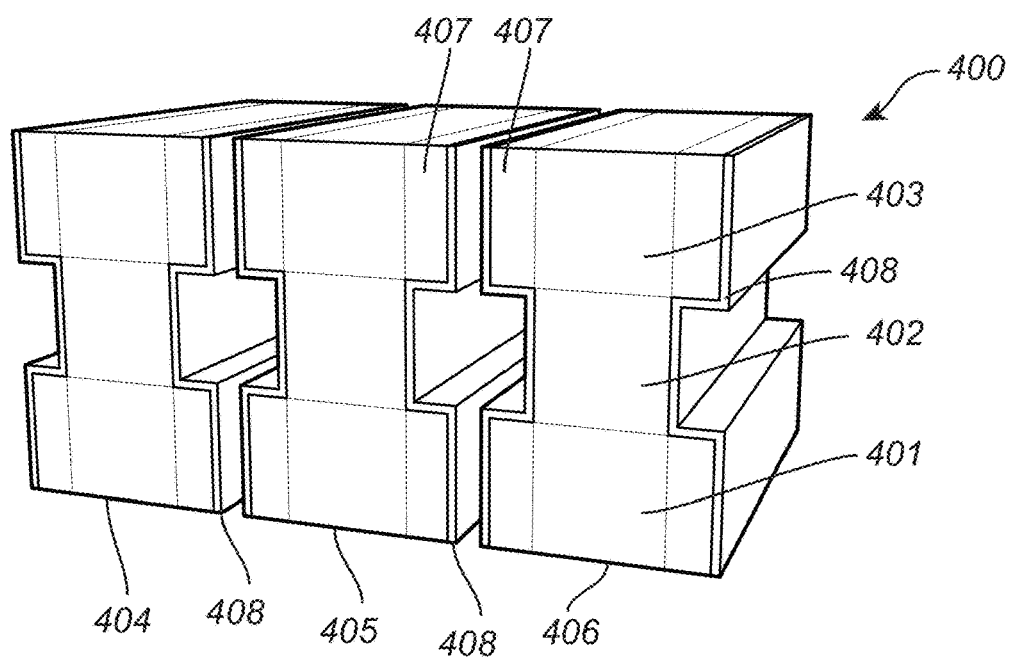
FIG. 4 illustrates a perspective view of the fin structure, with a gate oxide or gate oxide stack formed on the sidewalls of the first layer, second layer and third layer.

FIG. 4 shows a perspective view of the fin structure 400, which may be similar to the structure described with reference to FIG. 3, with three fins, a first 401, second 402 and third layer 403 and a dielectric 407, but where a gate oxide or gate oxide stack 408 may be formed on the sidewalls of the first layer 401, second layer 402 and third layer 403. In this way the second layer 402 may define a vertical channel region of a FET. The gate oxide stack 408 may be different to the dielectric previously formed on the first and third layer, and may in some example be a high-k material such as e.g. SiO$_2$.

Figure 5:
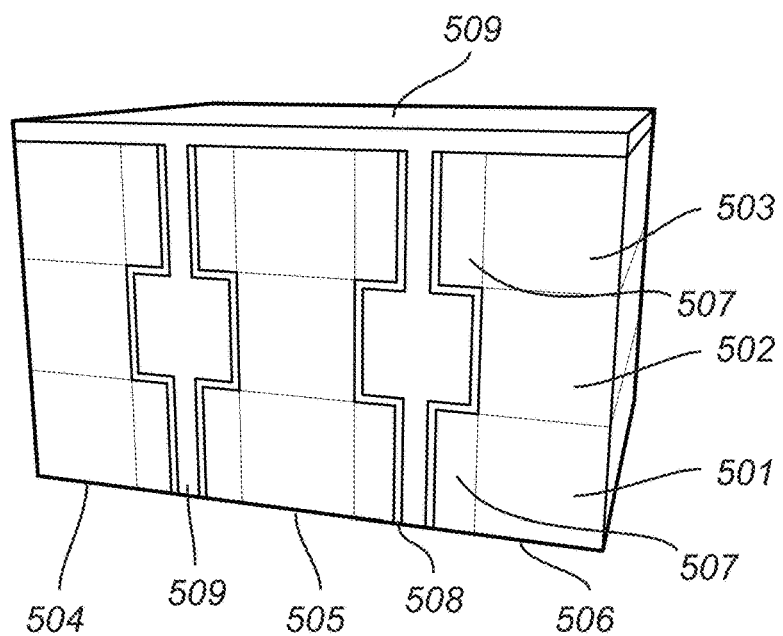
FIG. 5 illustrates a perspective view of a fin structure, with a dielectric, a gate oxide stack, a gate contacting layer provided between the fins for contacting the sidewall of the second layer.

FIG. 5 shows a perspective view of a fin structure 500, which may be similar to the structure as described with reference to FIG. 4, with three fins 504, 505, 506, a first 501, second 502 and third layer 503, a dielectric 507, a gate oxide stack 508, further comprising a gate contacting layer 509 provided between the fins for contacting the sidewall of the second layer 502. The gate contacting layer 509, which, for example, may comprise W or Co, may thus form the gate contacts of the transistor devices.

The gate contacting layer 509 may be provided to fill the space between the fins 5043 505, 506 and such that is covers the third layer 503. Due to the dielectric 507 that has been selectively formed on the first and third layer, the gate electrode that contacts the channel region 502 may be vertically aligned between the dielectric 507 on the sidewalls of the first layer 501 and the third layer 503. Thus, the channel region may be self-aligned in the vertical direction of the fin.

The word "contacting" may not be limited to ohmic contact due to possible gate oxide between the layers. It may for example be a gate contact that operates by means of an electrical field as in for example a field-effect transistor (FET).

Figure 6:
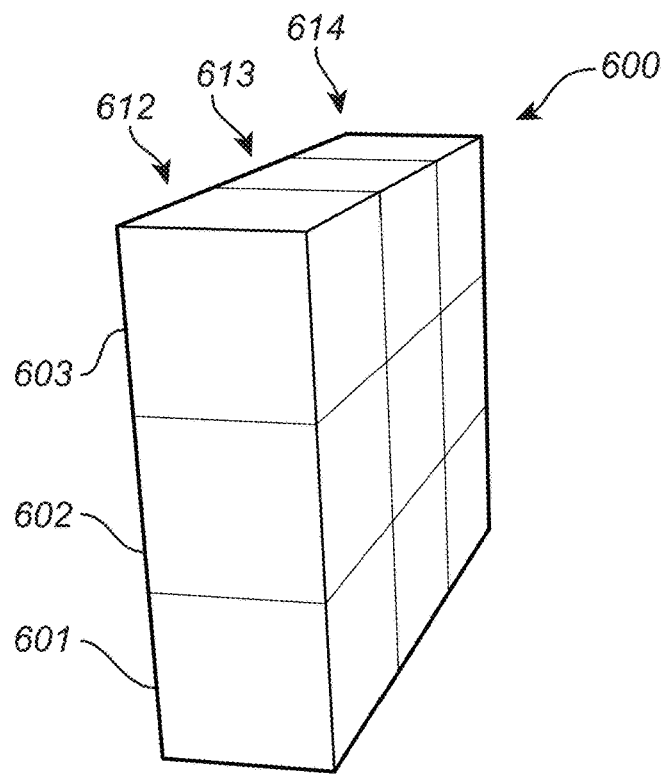
FIG. 6 illustrates a perspective view of a fin where the layers have been formed by means of epitaxial growth.

In order to form different types of transistor devices, such as, for example, N-type and P-type transistors, each fin may comprise vertical regions of different doping. An example of such regions is illustrated in FIG. 6, which shows a perspective view of a fin 600 where the layers have been formed by means of epitaxial growth. During the epitaxial growth, impurities may be added to the material so as to form N and P doped regions of each layer. In one example, the fin may be horizontally divided into three vertical regions or parts, i.e., a first part 612, a second part 613 and a third part 614. In the first region 612 and the third region 614, the first and the third layer 601, 603 may be P-doped and the second layer N-doped. The first region 612 and the third region 614 may therefore be formed into an N-type transistor, respectively. The second region 613 may comprise first and third layers 601, 603 that are N-doped, and a second layer that is P-doped. Thereby a P-type transistor may be formed. The doping may, for example, be performed separately for each layer and region, for example, by adding impurities during epitaxial growth of the respective layer and/or implanting ions afterwards. In ion implantation, ions of a dopant material may be accelerated in an electrical field and impacted into the material to be doped.

Figure 7A:
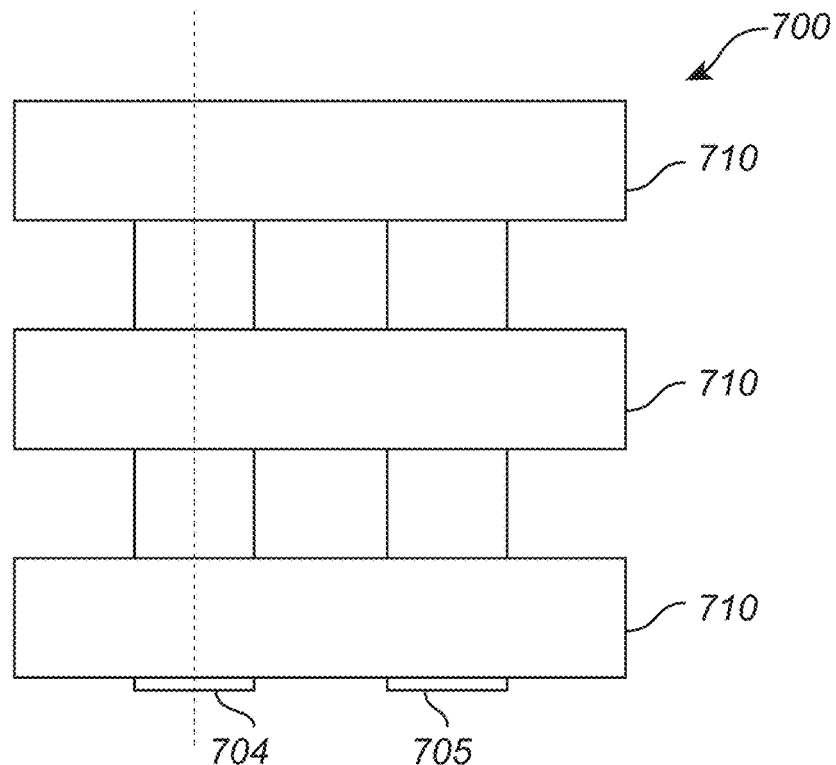
FIG. 7a illustrates a top view of two fins.
Figure 7B:
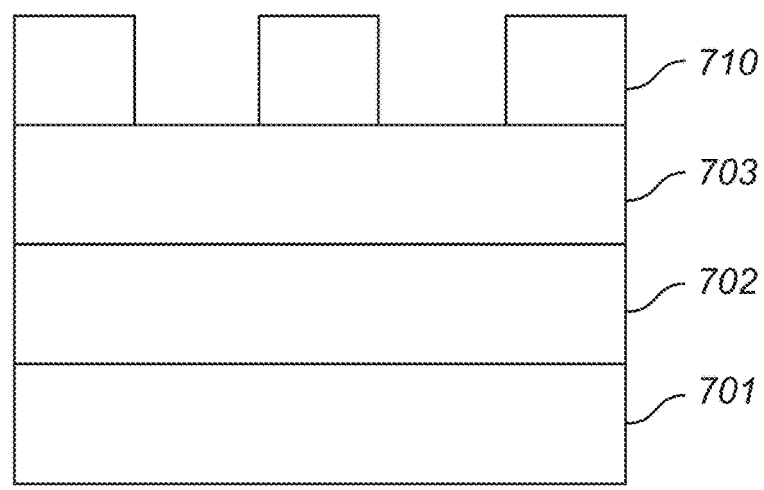
FIG. 7b illustrates a side view of one of the fins, where each fin may be similar to the fins as described with reference to FIG. 5.

FIG. 7a shows a top view of two fins 704, 705 and FIG. 7b shows a side view of one of the fins (as seen through the dotted line of FIG. 7a), where each fin may be similar to the fins as described with reference to FIG. 5. The gate contacting layer may be formed of three parallel gate lines 710, extending orthogonal to the fins 704, 705 and above the third layer 703 along the contour of the fin. The material of the gate lines 710 may be the same in all gate lines 710. Further, these gate lines 710 may be used as an etch mask 728 when forming the fins into pillars.

Figure 8A:
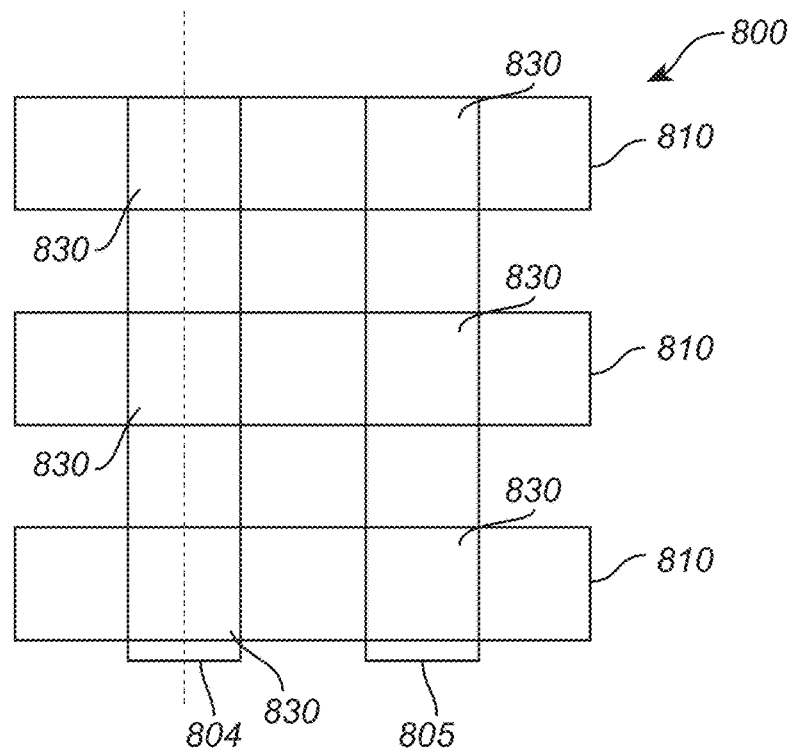
FIG. 8a illustrates a top view of the two fins.
Figure 8B:
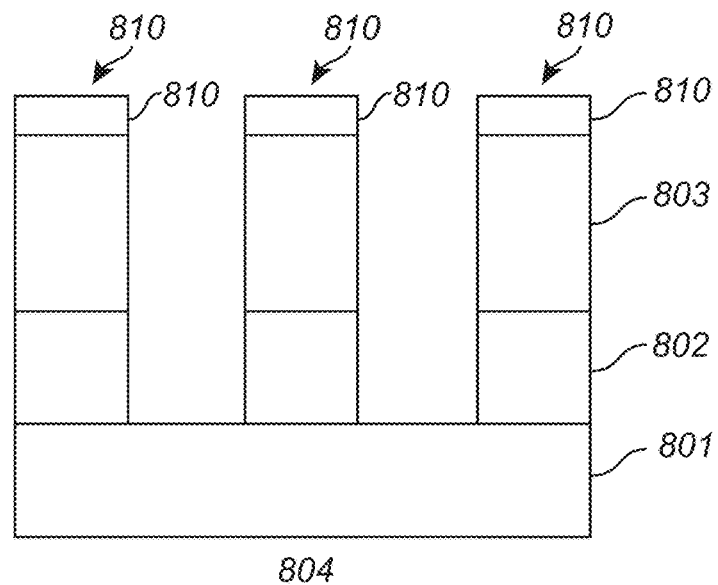
FIG. 8b illustrates a side view of one of the fins.

FIG. 8a shows a top view of the two fins 800 and FIG. 8b shows a side view of one of the fins (as seen through the dotted line of FIG. 8a). The fins may be similar to the fins as described with reference to FIGS. 7a and 7b. As shown in the present figure, the second layer 802 and the third layer 803 may be etched through the etch mask 728 to form a pillar 811 of each fin. At the intersection between the fins 804, 805 and the gate lines 810 a pillar 811 may be formed into a transistor device 830. The first layer 801, or the bottom layer, may be a common layer or common drain to all vertical transistor devices of the same fin, since the etching may stop on the first layer 801. Alternatively, the first layer 801 may be etched as well to separate the transistor devices 830 from each other. This step may be followed by a re-growth of a layer between the pillars, preferably of a doped material, forming a bottom electrode connecting the source/drain regions of the transistor devices 830.

Each fin may comprise a first vertical region in which the first layer 801 and the third layer 803 may be N-doped and the second layer 802 may be P-doped. The first vertical region may thereby form an N-type transistor device. Each fin may further comprise a second vertical region in which the first layer 801 and the third layer 803 may be P-doped and the second layer 802 may be N-doped. The second vertical region may thereby form a P-type transistor device.

Further, each of the fins may have a transistor pair formed by a P-type and N-type transistor device and a remaining transistor device formed by a N-type or P-type transistor device. As an example, there may be formed one P-type transistor device and at least two N-type transistor devices of each fin, or at least two P-type transistor devices and at least one N-type transistor device.

The gate lines 810 may also be interrupted in between the fins such that the gate of the transistor devices in the first fin 804 are isolated from the gate of the transistor devices in the second fin 805. Since the source and the drain region are arranged above each other, the current flows in the vertical direction and forms a vertical transistor device. As the gate lines 810 may be arranged on both lateral sides of the fin 804, 805, the gate of the transistor device 830 may be contacted from either side (or both sides) of the fin 804, 805.

The transistor devices of each fin may be interconnected to form a static random access memory, SRAM device. In one example six transistor devices of two fins may form a SRAM device. The SRAM device may include two N-type transistor devices and four P-type transistor devices or two P-type transistors and four N-type transistors. The SRAM device normally comprises pass-gate (PG) transistors, pull-down transistors (PD) and pull-up transistors (PU) formed of the N- and P-type transistor devices.

Figure 9:
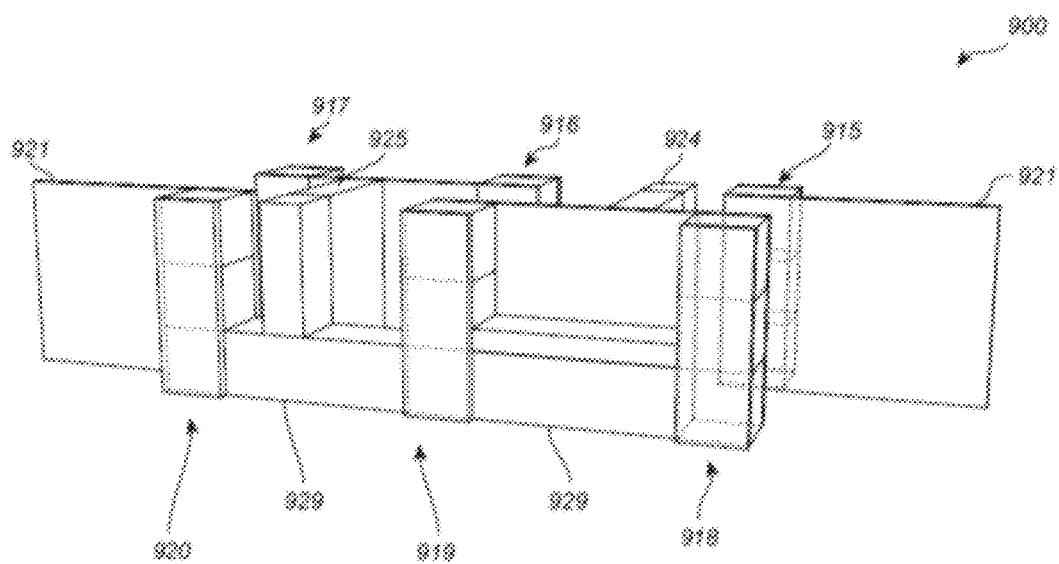
FIG. 9 illustrates an example of an SRAM device according to an embodiment.

FIG. 9 shows an example of an SRAM device 900 according to an embodiment. The SRAM device may be formed from two fins, i.e., a first fin and a second fin. The fins may be formed into six vertical transistor devices, a first 915, second 916 and third 917 transistor device of the first fin and a fourth 918, fifth 919 sixth transistor device 920 of the second fin.

The three transistor devices of each of the fins may be connected to their neighbour transistor device of their fin by the drain connection formed by the first layer of that fin. The first layer may be silicided at the part forming the drain connection between two neighbouring transistors.

The gates of the transistor pair of each fin may be electrically connected together and further electrically connected to the drain connection of the transistor pair in the other fin such that an SRAM cell is formed. The electrical connections may be formed at least in the region between the two parallel fins, which allows for a relatively short interconnection between the transistor devices and hence an efficient area usage. Reducing the interconnection length further allows for a reduced capacitance and hence an increased speed of the SRAM cell.

The electrical connection to the drain connection may also extend beyond the region in between the two parallel fins. In some cases, the SRAM cell may be contacted from a point outside the periphery of the cell, which facilitates connection to other fins or logic components.

The gates of the remaining transistor devices, for example the respective gate of the first transistor device 915 and the sixth transistor device 920, may be electrically connected to a wordline (WL) 921 which may be used for controlling access to a storage cell during read and write operations. The gate of the sixth transistor device 920 may also be electrically connected to a bitline (BL) and the gate of the first transistor device 915 may be electrically connected to an inverted bitline (iBL). The electrical interconnections may be formed at least in the region between the two parallel fins. The bitlines may be used to transfer data for both read and write operations of the memory cell. The gates of the second 916 and third transistors 917, may be electrically connected together by connection 925 and also electrically connected to the drain connection 929 of the transistor pair 920, 919 in the second fin. Thus, an SRAM cell may be provided in which the electrical connections may be formed at least in the region between the two parallel fins. In a similar way, the gates of the fourth 918 and fifth 919 transistor devices may be electrically connected together by connection 924 and also electrically connected to the drain connection (not shown) of the transistor pair 916, 915 in the first fin, so as to form a cross-coupled inverter pair.

Figure 10:
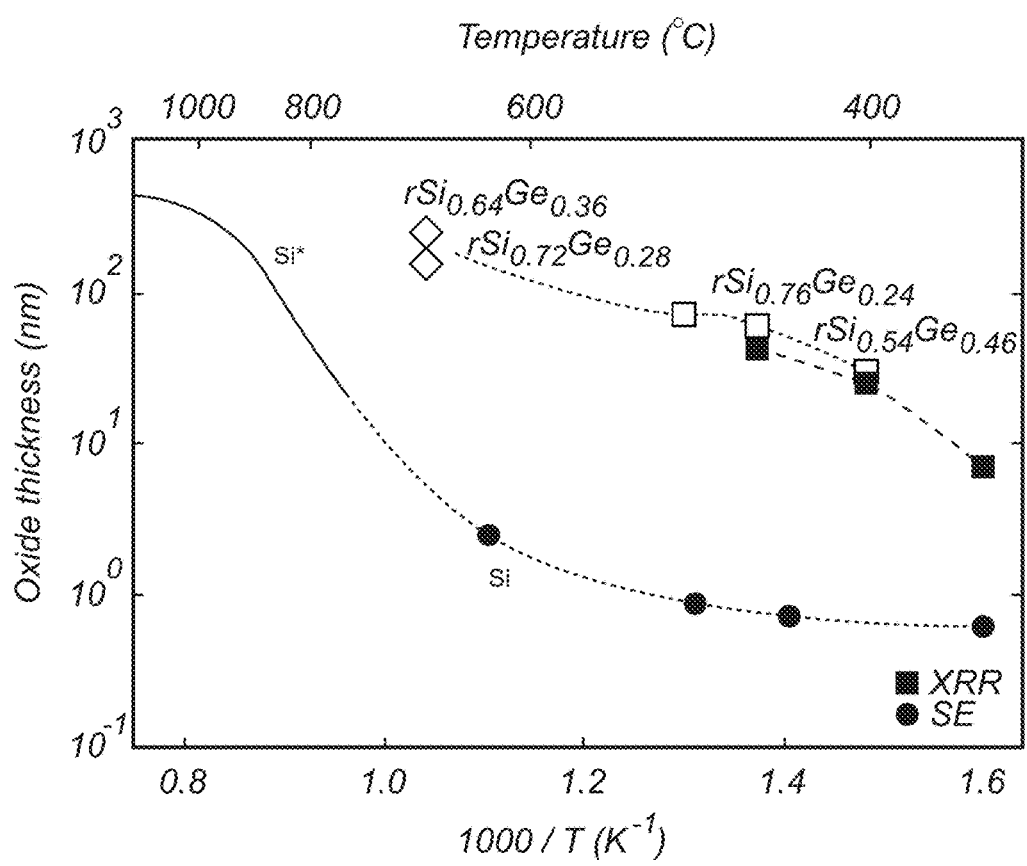
FIG. 10 illustrates a diagram showing an example of how the materials forming the first, second and third layers may affect how oxide (dielectric) grows to different oxide thicknesses at different temperatures.

FIG. 10 is a diagram showing an example of how the materials forming the first, second and third layers may affect how the oxide (dielectric) grows to different oxide thicknesses at different temperatures. In the specific example, the oxide growth on Si and SiGe is shown. The oxide thickness is represented by the vertical y-axis and the temperature is represented by the horizontal x-axis. As indicated in FIG. 10, SiGe may oxidize at much higher rates that Si, and in particular at temperatures between 400° C. and 700° C. The selective deposition of the dielectric may therefore be realised by oxidizing first and third layers of SiGe and a second layer of Si at such a temperature interval, followed by a step of removing the oxide from the Si layer so as to allow the gate layer to contact the channel region of the transistor device.

Alternatively, or additionally, the selective forming of the dielectric may be achieved by functionalizing (or preparing) the surface of the layers in a manner that allows for the dielectric, such as e.g. an oxide, to deposit faster on sidewall surfaces of the first and third layers and slower on the sidewall surface(s) of the second layer. One option may be to utilise atomic layer deposition (ALD), which may enhance deposition on the sidewall surfaces of the first and third layers, while another option may be to use ALD or chemical vapour deposition (CVD) to inhibit nucleation of the sidewall surface of the second layer. Further, hydrophilic —H bonds and hydrophobic —O—H bonds may be used to achieve a selectivity in the forming of the dielectric.

As described above, the disclosed technology has mainly been described with reference to a limited number of examples. However, as is readily appreciated by a person skilled in the art, other examples than the ones disclosed above are equally possible within the scope of the disclosed technology, as defined by the appended claims.

While certain embodiments of the disclosed technology have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of forming a vertical transistor device, the method comprising:
    forming, on a substrate, a fin formed of a stack including a first layer, a second layer formed above the first layer and a third layer formed above the second layer;
    forming a dielectric on sidewalls of the first and third layers of the fin selectively against a sidewall of the second layer, wherein selectively forming the dielectric comprises:
        oxidizing the first, second and third layers at a temperature and pressure such that a thicker dielectric is formed on the first and third layers than on the second layer, and
        subsequently etching the dielectric to expose the sidewall of the second layer such that at least some of the dielectric remains on the sidewalls of first and third layers; and
    forming a gate contacting layer for contacting the sidewall of the second layer,
    wherein the first and third layers define a source region and a drain region, respectively, of the vertical transistor device,
    wherein the second layer defines a channel region of the vertical transistor device, and
    wherein the dielectric on the sidewalls of the first and third layers electrically isolates the source and drain regions from the gate contacting layer.

2. The method according to claim 1, wherein the method further comprises forming a gate oxide stack on the sidewall of the second layer prior to forming the gate contacting layer.

3. The method according to claim 1, further comprising providing at least two parallel fins, wherein:
    the gate contacting layer comprises at least three parallel gate lines, the gate lines being isolated from each other and orthogonal to the at least two fins; and
    each of the fins comprises a first vertical region for forming an N-type transistor device, and a second vertical region for forming a P-type transistor device.

4. The method according to claim 3, comprising:
    forming a first one of the fins into a first transistor device, a second transistor device and a third transistor device; and
    forming a second one of the fins into a fourth transistor device, a fifth transistor device and a sixth transistor device,
    wherein each of the fins has a transistor pair formed of a P-type transistor device and an N-type transistor device.

5. The method according to claim 4, wherein the gate lines are interrupted in between the fins so as to isolate a gate of the first to third transistor devices in the first one of the fins from a gate of the fourth to sixth transistor devices in the second one of the fins.

6. The method according to claim 4, wherein the transistor devices of each of the fins are connected to a neighboring transistor device by a drain connection formed by the first layer of the each of the fins.

7. The method according to claim 6, further comprising siliciding a portion of the first layer of each of the fins forming the drain connection between two neighboring transistors.

8. The method according to claim 6, further comprising electrically connecting gates of the transistor pair of each of the fins and electrically connecting the gates to the drain connection of the transistor pair in the other fin, thereby forming a static random access memory (SRAM) cell wherein electrical connections are formed at least in a region between the at least two parallel fins.

9. The method according to claim 8, wherein an electrical connection to the drain connection extends beyond the region in between the at least two parallel fins.

10. The method according to claim 8, further comprising electrically connecting the gate of the remaining transistor devices of each of the fins to a bit line and a word line, respectively, wherein the electrical connections are formed at least in the region between the two parallel fins.

11. The method according to claim 1, wherein the second layer of the fin has a different composition from the first and third layers of the fin.

12. The method according to claim 11, wherein selectively forming the dielectric comprises simultaneously oxidizing the sidewalls of the first, second and third layers of the fin, wherein simultaneously oxidizing comprises thermally oxidizing at a temperature such that a thermal oxide is formed on the second layer of the fin structures at a slower growth rate compared to thermal oxides formed on the first and third layers of the fin.

13. The method according to claim 12, wherein simultaneously oxidizing comprises thermally oxidizing at a temperature between 400° C. and 700° C.

14. The method according to claim 1, wherein the second layer of the fin has a higher silicon content compared to first and third layers of the fin.

15. The method according to claim 14, wherein the second layer is formed of silicon (Si) and the first layer and the third layers are formed of silicon-germanium (SiGe).

* * * * *